United States Patent
Yang et al.

(10) Patent No.: US 8,650,520 B2
(45) Date of Patent: Feb. 11, 2014

(54) INTEGRATED CIRCUIT MODULE AND MANUFACTURING METHODS AND APPLICATION THEREOF

(75) Inventors: Shu-Yi Yang, Hsinchu (TW); Chen-Hsien Hsu, Hsinchu County (TW); Jinn-Shyan Wang, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/174,832

(22) Filed: Jul. 1, 2011

(65) Prior Publication Data

US 2013/0007678 A1 Jan. 3, 2013

(51) Int. Cl.
G06F 17/50 (2006.01)
(52) U.S. Cl.
USPC .......................................... 716/110
(58) Field of Classification Search
USPC ................................. 716/100, 110
See application file for complete search history.

(56) References Cited

U.S. PATENT DOCUMENTS

| | | | |
|---|---|---|---|
| 4,271,820 A | 6/1981 | Holley | |
| 6,427,226 B1 | 7/2002 | Mallick et al. | |
| 6,653,868 B2 | 11/2003 | Oodaira et al. | |
| 6,668,358 B2 | 12/2003 | Friend et al. | |
| 8,129,262 B1 * | 3/2012 | Bulucea et al. | 438/546 |
| 8,169,432 B2 * | 5/2012 | Yamamoto et al. | 345/214 |
| 2002/0094697 A1 * | 7/2002 | Leung et al. | 438/766 |
| 2004/0099891 A1 * | 5/2004 | Mehrotra et al. | 257/288 |
| 2008/0189662 A1 | 8/2008 | Nandy et al. | |
| 2009/0309162 A1 * | 12/2009 | Baumgartner et al. | 257/368 |
| 2010/0033476 A1 * | 2/2010 | Yamamoto et al. | 345/214 |
| 2012/0146157 A1 * | 6/2012 | Baumgartner et al. | 257/401 |

OTHER PUBLICATIONS

Tae-Hyoung Kim, Hanyong Eom, John Keane, and Chris Kim, "Utilizing Reverse Short Channel Effect for Optimal Subthreshold Circuit Design", 2006, p. 127-130, ACM.
Tae-Hyoung Kim, John Keane, Hanyong Eom, Chris H. Kim, Utilizing Reverse Short-Channel Effect for Optimal Subthreshold Circuit Design, IEEE Transactions on Very Large Scale Integration (VLSI) Systems, pp. 821-829, vol. 15, No. 7, Jul. 2007.
Tae-Hyoung Kim, Jason Liu, John Keane, Chris H. Kim, A 0.2 V, 480 kb Subthreshold SRAM With 1 k Cells Per Bitline for Ultra-Low-Voltage Computing, IEEE Journal of Solid-State Circuits, pp. 518-529, vol. 43, No. 2, Feb. 2008.

* cited by examiner

*Primary Examiner* — Suchin Parihar
(74) *Attorney, Agent, or Firm* — Ding Yu Tan

(57) ABSTRACT

An exemplary integrated circuit module includes a first transistor and a second transistor. The first transistor has a first channel length and a first threshold voltage. The second transistor is electrically coupled to the first transistor and has a second channel length and a second threshold voltage. The second channel length is greater than the first channel length, the absolute value of the second threshold voltage is smaller than the absolute value of the first threshold voltage, and the first transistor and the second transistor have a same threshold voltage implant concentration. Moreover, a manufacturing method of such integrated circuit module, and an application of such integrated circuit module to computer aided design of logic circuit also are provided.

18 Claims, 4 Drawing Sheets

INTEGRATED CIRCUIT MODULE AND MANUFACTURING METHODS AND APPLICATION THEREOF

TECHNICAL FIELD

The present disclosure generally relates to an integrated circuit module and manufacturing method and application thereof, and more particularly to an integrated circuit module including a transistor with reverse short channel effect (RSCE) and a manufacturing method and an application thereof.

BACKGROUND

With the increasing complexity of integrated circuits, the critical dimension and layout space correspondingly are increasingly shrunk. In order to meet the increasing efficiency and volume density demands of super large scale integrated circuits, the increase of process density and the miniaturization of device still are a continuing challenge for semiconductor process and designers.

Since the critical dimension of current process has approximately reached the physical extreme of optical instruments, so that the steps such as locating, developing, etching and chemical mechanical polishing would not readily achieve expected accuracy like that in the traditional process. Therefore, for the circuit design, if the process extreme is not taken in consideration, it is more possible to cause the short channel effect (SCE), resulting in the problems of threshold voltage shift of transistor, punch-through effect and increasing of leakage current and thereby the process yield is degraded.

In order to improve the short channel effect, a pocket or halo implant structure is widely adopted. In particular, an n-type dopant is implanted into a p-type metal-oxide-semiconductor (PMOS) device while a p-type dopant is implanted into an NMOS device, the halo implant region of such dopant generally is at the periphery of drain and source neighboring the gate. As a result, the punch-through effect can be suppressed and the threshold voltage of device can be increased to thereby decrease the leakage current.

However, when the semiconductor device is operated in sub-threshold region, the reverse short channel effect adverse for the device would occur. This is because the pocket or halo implant would weak the drain induced barrier lowing effect, the halo implant over-compensates the threshold voltage of device, so that the driving capability of device is weakened, the power consumption is increased and causing timing violation.

In order to solve the above-mentioned problems, a conventional solution of increasing channel lengths of all devices has been proposed to relieve the phenomenon of threshold voltage increase caused by the reverse short channel effect in complementary MOS devices. However, the increase of channel length for all devices would result in the increase of critical dimension, which violates the design purpose of decreasing the process density.

Another conventional solution is to fix the operation voltage of integrated circuit in sub-threshold region and use the reverse short channel effect to shrink the transistor size, so as to save the layout area, reduce the capacitive loads of drain and source and improve the circuit power performance. However, such conventional solution would seriously limit the design flexibility and application range of logic circuit.

Accordingly, there is a need to provide an improved integrated circuit module and a manufacturing method and an application thereof, which is applicable in any range of operation voltage and can reduce the process density and manufacturing cost on the prerequisite of taking account of operation speed and power consumption.

SUMMARY OF EMBODIMENTS

More specifically, an objective of the present disclosure is to provide an integrated circuit module including a first transistor and a second transistor. The first transistor has a first channel length and a first threshold voltage. The second transistor is electrically coupled to the first transistor and has a second channel length and a second threshold voltage. The second channel length is greater than the first channel length, the absolute value of the second threshold voltage is smaller than the absolute value of the first threshold voltage, and the first transistor and the second transistor have a same threshold voltage implant concentration.

In an exemplary embodiment, a source of the second transistor is grounded. In another exemplary embodiment, the second channel length is twice of the first channel length. In still another exemplary embodiment, each of the first and second transistors has a pocket or halo implant region.

In an exemplary embodiment, the integrated circuit module is operated in sub-threshold region and has an operation voltage of no more than about 0.5V. In another exemplary embodiment, the integrated circuit module has an operation voltage higher than, lower than or fall in the range of 0.9V~1.2V.

In an exemplary embodiment, the integrated circuit module further includes a third transistor electrically coupled to the first and second transistors. The third transistor has the same threshold voltage implant concentration as the second transistor. The third transistor has a third channel length and a third threshold voltage, the third channel length is smaller than the second channel length, and the absolute value of the third threshold voltage is greater than the absolute value of the second threshold voltage.

Another objective of the present disclosure is to provide method for manufacturing an integrated circuit module. The method includes the following steps of: providing a substrate; sequentially forming a gate dielectric layer and a gate material layer on the substrate in that order; performing a threshold voltage implant process on the gate material layer to define a threshold voltage implant region in the substrate; and forming a first transistor and a second transistor electrically coupled with each other on the substrate and thereby respectively defining a first channel and a second channel in the threshold voltage implant region, wherein a length of the second channel is greater than that of the first channel.

In an exemplary embodiment, the formation of the first and second transistors includes the following sub-steps of: patterning the gate dielectric layer and the gate material layer to form a first gate and a second gate; and performing at least an ion implant process to define a first source and drain region and a second source and drain region in the substrate respectively neighboring with the first gate and the second gate.

In an exemplary embodiment, the method further includes a step of: performing a halo implant process to form a first halo implant region and a second halo implant region respectively underlying the first channel and the second channel and respectively neighboring with the first source and drain region and the second source and drain region. In another exemplary embodiment, the method further includes a step of: forming a grounding path to ground the source of the second transistor.

In an exemplary embodiment, in the method, the length of the second channel is twice of the length of the first channel.

In an exemplary embodiment, the method further includes a step of: forming a third transistor simultaneously with the formation of the first and second transistors. The third transistor is electrically coupled with the first and second transistors, and a length of a third channel of the third transistor is smaller than the length of the second channel.

Still another objective of the present disclosure is to provide a computer aided design method for creating a logic circuit. The computer aided design method includes steps of: simulating a design of the logic circuit, the logic circuit being comprised of a plurality of standard integrated circuit modules; analyzing the logic circuit to determine a critical path in the logic circuit; and providing an integrated circuit module with reverse short channel effect to replace at least one of the standard integrated circuit modules in the critical path. In particular, the integrated circuit module with revere short channel effect includes a first transistor and a second transistor. The first transistor has a first channel length and a first threshold voltage. The second transistor is electrically coupled to the first transistor and has a second channel length and a second threshold voltage. The second channel length is greater than the first channel length, the absolute value of the second threshold voltage is smaller than the absolute value of the first threshold voltage, and the first transistor and the second transistor have a same threshold voltage implant concentration.

In an exemplary embodiment, in the computer aided design method, a source of the second transistor is grounded. In another exemplary embodiment, the integrated circuit module with reverse short channel effect is operated in sub-threshold region and has an operation voltage of no more than about 0.5V. In still another exemplary embodiment, the integrated circuit module with reverse short channel effect has an operation voltage higher than, lower than or fall in the range of about 0.9V~1.2V.

In an exemplary embodiment, in the computer aided design method, each of the first and second transistors has a halo implant region.

In an exemplary embodiment, in the computer aided design method, the integrated circuit module with reverse short channel effect further includes a third transistor electrically coupled to the first and second transistors and having the same threshold voltage implant concentration as the second transistor, the third transistor has a third channel length and a third threshold voltage, the third channel length is smaller than the second channel length, and the absolute value of the third threshold voltage is greater than the absolute value of the second threshold voltage.

In short, in the above described exemplary embodiments, the integrated circuit module includes transistors with at least two different channel lengths and reverse short channel effect formed in a same semiconductor process, when the integrated circuit module is used for the design of logic circuit, only some circuit module(s) in the critical path is/are selected to perform low voltage operation to increase the whole circuit performance, so as to improve the timing violation issue. Since there is no need of replacing all the transistors in the logic circuit to be transistors with reverse short channel effect, and also no need of fixing the operation voltage of the logic circuit in sub-threshold voltage range, the design of logic circuit becomes more flexible. In addition, the channel length of second transistor is lengthened by using the known transistor manufacturing process, which does not change the critical dimension of transistor and thus would not decrease the process density. Moreover, due to the increase of channel length, the transistor process variation immunity correspondingly is increased, facilitating the reduction of manufacturing cost. Accordingly, the problems in the prior art can be effectively solved, achieving the purpose of developing the present invention.

BRIEF DESCRIPTION OF THE DRAWINGS

The above objects and advantages of the present disclosure will become more readily apparent to those ordinarily skilled in the art after reviewing the following detailed description and accompanying drawings, in which.

DETAILED DESCRIPTION OF EMBODIMENTS

An objective of the present disclosure is to provide an integrated circuit module and a manufacturing method and an application thereof, such integrated circuit module is applicable in any range of operation voltage and can reduce the process density and manufacturing cost on the prerequisite of taking account of operation speed and power consumption of integrated circuit. Hereinafter, in order to make the above objective or other objectives and advantages of the present disclosure be more readily apparent to those ordinarily skilled in the art, multiple types of integrated circuit modules with reverse short channel effect and application methods thereof taken as exemplary embodiments will be described more specifically with reference to the accompanying drawings. It is to be noted that the following descriptions of exemplary embodiments of this invention are presented herein for purpose of illustration and description only. It is not intended to be exhaustive or to be limited to the precise form disclosed.

Referring to FIGS. 1A through 1F, FIGS. 1A through 1F show schematic cross-sectional views of the processing structures for forming a complementary metal-oxide-semiconductor (CMOS) inverter 100 in accordance with an exemplary embodiment. The CMOS inverter 100 may primarily include several steps as follows.

Figure 1A:
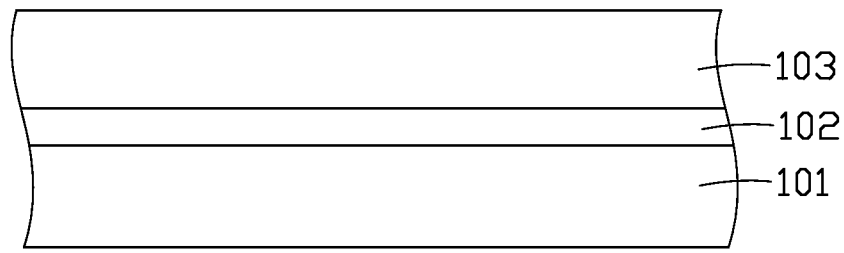
FIGS. 1A through 1F show schematic cross-sectional views of the processing structures for forming a complementary metal-oxide-semiconductor (CMOS) inverter in accordance with an exemplary embodiment.

Firstly, a substrate 101 is provided. The substrate 101 then is sequentially formed with a gate dielectric layer 102 and a gate material layer 103 thereon in that order (as illustrated in FIG. 1A).

Figure 1B:
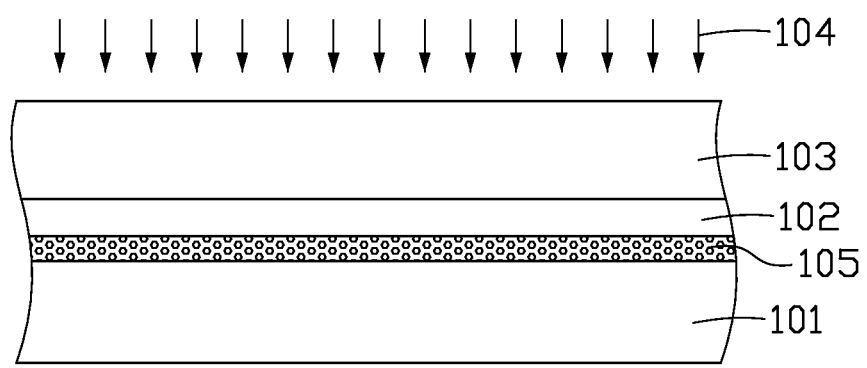

Subsequently, a threshold voltage implant process is performed on the gate material layer 103 to define a threshold voltage implant region 105 in the substrate 101 (as illustrated in FIG. 1B). In a preferred embodiment, the threshold voltage implant process 104 for example uses a p-type dopant such as boron (but not to limit the present disclosure) to perform an implant process on a surface of the substrate 101, so as to form the threshold voltage implant region 105 downwardly extending from the surface of the substrate 101.

Figure 1C:
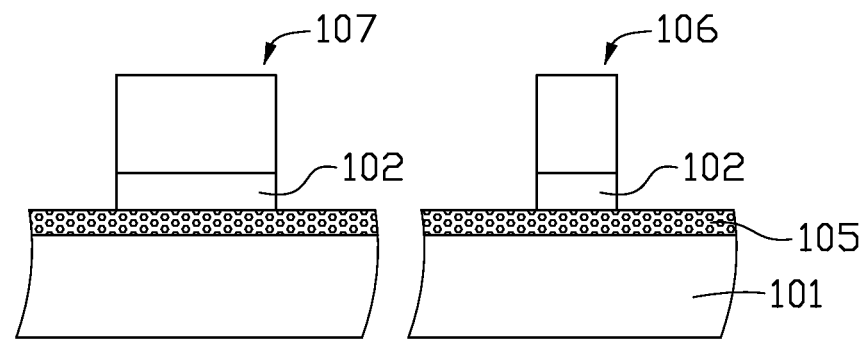
Figure 1D:
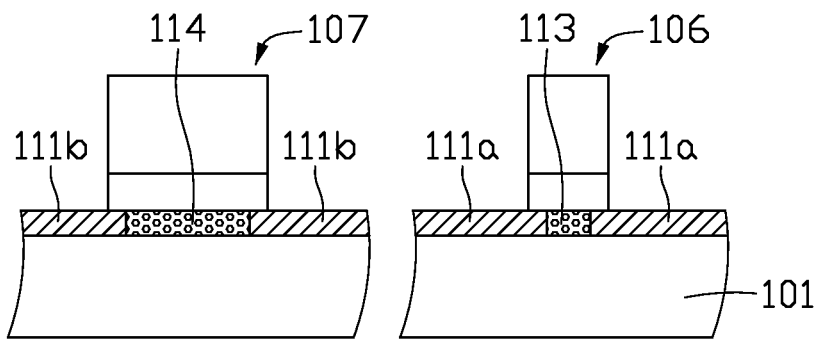

Next, the gate dielectric layer 102 and the gate material layer 103 are patterned to form a first gate 106 and a second gate 107 (as illustrated in FIG. 1C). Thereafter, a lightly-doped implant process is firstly optionally performed using the first gate 106 as a mask, so as to form a p type first lightly-doped region 111a; an another lightly-doped implant process is then performed using the second gate 107 as a mask, so as to form a n type second lightly-doped region 111b in the substrate 101, thereby a first channel 113 and a second channel 114 are respectively defined in the threshold voltage implant region 105 (as illustrated in FIG. 1D). Herein, a length of the second channel 114 is greater than that of the first channel 113, and advantageously the length of the second channel 114 is twice of that of the first channel 113.

Figure 1E:
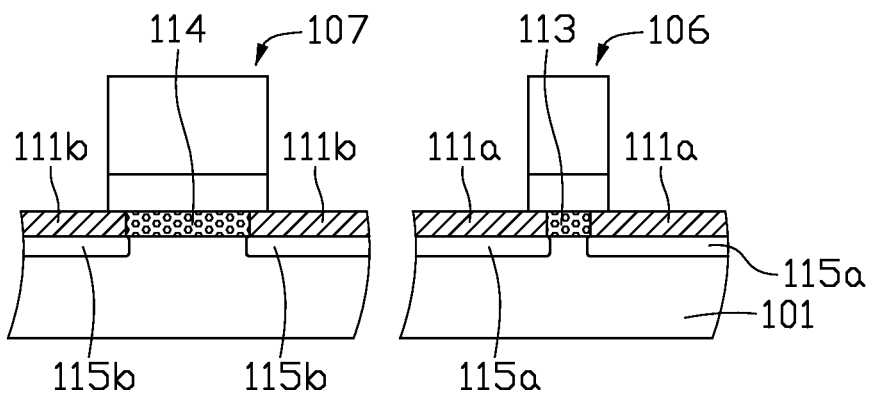
Figure 1F:
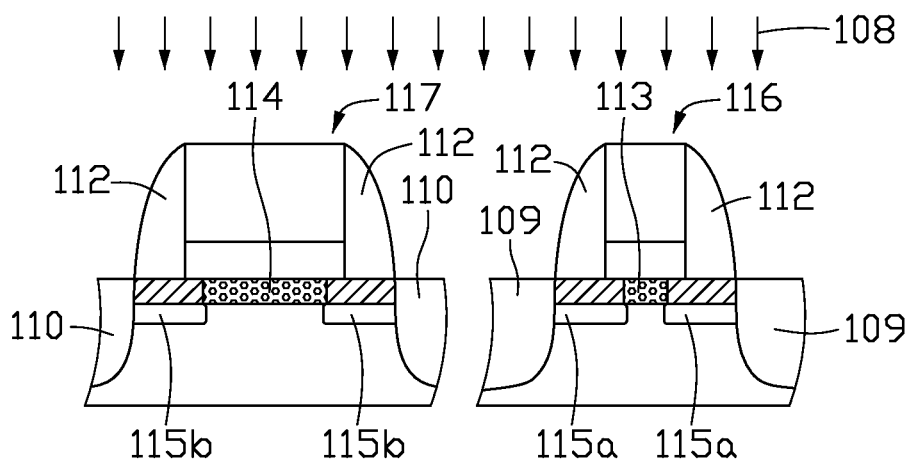

Afterwards, a pocket or halo implant process is optionally performed to form an n type first halo implant region 115a and a p type second halo implant region 115b (as illustrated in FIG. 1E) respectively under the first lightly-doped region 111a and the second lightly-doped region 111b. Next, deposition and/or thermal oxidation process are performed to form spacers 112 on sidewalls of the first gate 106 and the second gate 107. Subsequently, the first gate 106, the second gate 107 and the spacers 112 serve as a mask to carry out the ion implant process 108, so as to define the p type first source and drain region 109 and the n type second source and drain region 110. As a result, a first transistor 116 and a second transistor 117 are formed (as illustrated in FIG. 1F). In the exemplary embodiment, the absolute value of the threshold voltage of the second transistor 117 is smaller than that of the first transistor 116.

Finally, a subsequent process is performed to form a conductor such as an interconnect 118 to electrically couple the first transistor 116 with the second transistor 117, and thereby the fabrication of the CMOS inverter 100 with reverse short channel effect is completed consequently.

Figure 1G:
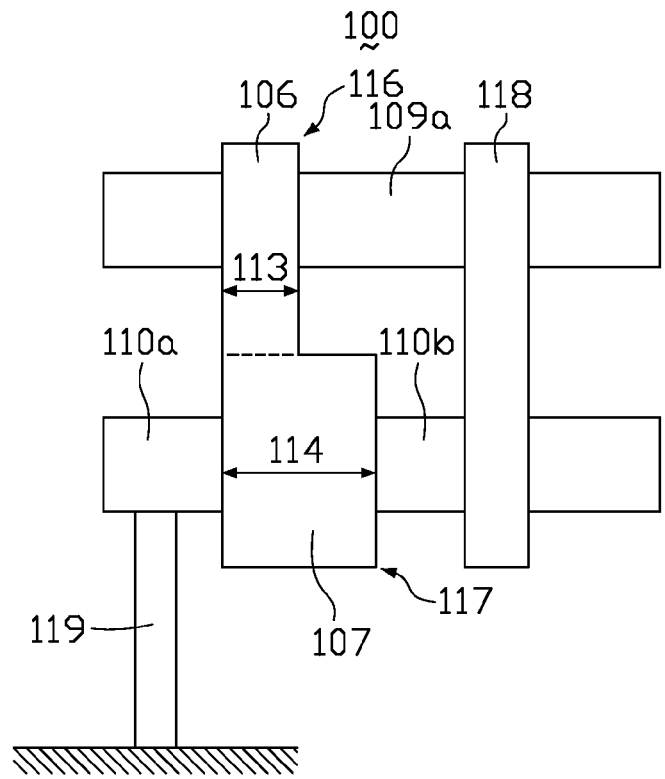
FIG. 1G shows a schematic top view of the CMOS inverter formed by the process steps shown by FIGS. 1A through 1F.

Referring to FIG. 1G, FIG. 1G shows a schematic top view of the CMOS inverter 100 with reverse short channel effect. As illustrated in FIG. 1G, the first transistor 116 and the second transistor 117 share a same gate line, a width of the first gate 106 for the first transistor 116 is about half of that of the second gate 107 for the second transistor 117. Moreover, the source 110a of the second transistor 117 is electrically coupled to a grounding path 119, and the drain 110b of the second transistor 117 is electrically coupled to the drain 109a of the first transistor 116 through the interconnect 118.

It is noted that, since the first transistor 116 and the second transistor 117 are formed by the same process in which the same substrate 101, gate dielectric layer 102 and gate material layer 103 are patterned, thus the first transistor 116 and the second transistor 117 have a same threshold voltage implant concentration. In accordance with short channel effect, while the device channel length is lengthen, the threshold voltage of the device may be reduced, and the operating current flowing through the device can be increased simultaneously. When the length of the first channel 113 is shrunk without varying the critical dimension of the CMOS inverter 100, the second channel 114 is grater than that of the first channel 113, and thus the absolute value of the second threshold voltage of the second transistor 117 is smaller than the absolute value of the first threshold voltage of the first transistor 116 by virtue of reverse short channel effect. In other words, the threshold voltage of the second transistor 117 can be relatively increased and the operating current flowing through transistor 117 is significantly increased.

In addition, because the first transistor 116 and the second transistor 117 share the same gate line, the dimension of the second gate 107 can be increased on the prerequisite of without changing the critical dimension of the first gate 106 to thereby achieve the purpose of lengthen the channel length of the second transistor 117, so that the transistors with two different channel lengths can be formed without increasing any additional photo mask or etching step. In another aspect, the channel length of the second transistor 117 is lengthened, and the process variation immunity of transistor correspondingly is increased. For example, the increase of channel length can relive the influence to the transistor threshold voltage caused by random dopant fluctuation (RDF) in the implant process, and therefore the process yield can be improved in some degree.

Generally, the aforementioned integrated circuit module of the present invention can applied in a logic circuit to solve the problems of power consumption and timing violation. Since parasitic effect of capacitance that exists between the two adjacent transistors may cause the delay in the switching times of the two adjacent transistors, such that the response of the logic circuit may be slow down. Thus, when the integrated circuit module including the first transistor 116 and the second transistor 117 of the present invention is applied in a logical, for example the CMOS inverter 100, the threshold of the second transistor 117 can be reduced and the operating current flowing through the second transistor 117 by virtue of the short channel effect, whereby the response of the CMOS inverter 100 can be accelerated and power consumption can be reduced. Accordingly the drawbacks and problems encountered from the prior logic circuit can be obviated.

Figure 1H:
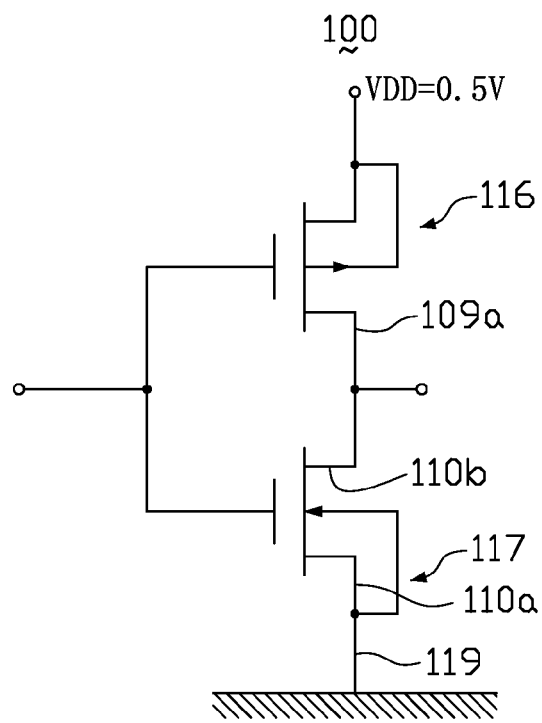
FIG. 1H shows a schematic transistor-level circuit diagram of the CMOS inverter formed by the process steps shown by FIGS. 1A through 1F.

Typically the integrated circuit module includes the closest transistor connected to the ground path. Referring to FIG. 1H, FIG. 1H shows a schematic transistor-level circuit diagram of the CMOS inverter 100 with reverse short channel effect. For example, in the present embodiment, the second transistor 117 of the integrated circuit module adopted in the CMOS inverter 100 is the closest transistor connected with the ground path. By adapting the present approach, because not all of the device (transistor) involving in the logic should be lengthen its channel length but the second transistor 117 which occupies little layout area, thus the logic circuit can not only benefit from the reverse short channel effect provided by the second transistor 117 but also conserve layout area.

In order to make the reverse short channel effect of the CMOS inverter 110 be dominant, the CMOS inverter 110 preferably is operated in sub-threshold region, e.g., the operation voltage VDD is no more than about 0.5V.

This is because the reverse short channel effect would change the threshold voltage of device and the sub-threshold current is exponentially influenced by the threshold voltage, so that the driving current would continuously increase along the increase of channel length until a saturation value is reached. If the CMOS inverter 110 is operated at a general voltage in the range of 0.9V~1.2V, since the influence of threshold voltage caused by the reverse short channel effect is very small with respect to the influence of saturation region current, the reverse short channel effect is relatively inconspicuous. In other embodiment, the integrated circuit module also can be operated at a voltage higher than, lower than or fall in the general operation voltage range.

Figure 2:
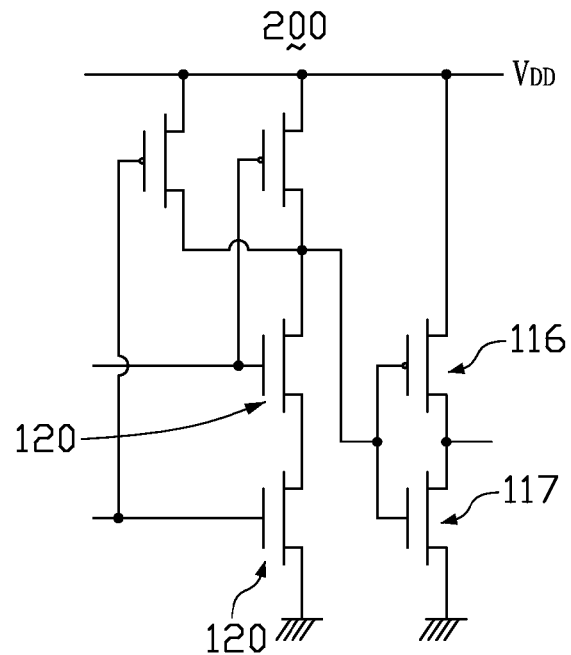
FIG. 2 shows a schematic transistor-level circuit diagram of an AND gate with reverse short channel effect in accordance with another exemplary embodiment.

It is noted that, the above embodiments only are for the purpose of illustrating the features of the present disclosure, the integrated circuit module with reverse short channel effect described in the above exemplary embodiments is applicable to other type of integrated circuit module such as a standard logic gate. Referring to FIG. 2, FIG. 2 shows a schematic transistor-level circuit diagram of an AND gate 200 with reverse short channel effect in accordance with another exemplary embodiment.

As illustrated in FIG. 2, besides the first transistor 116 and the second transistor 117, the AND gate 200 further includes multiple n type third transistors 120 electrically coupled to the first and second transistors 116, 117. Channel lengths of the third transistors 120 are shorter than that of the second transistor 117, and the absolute value of the threshold voltage for the third transistors 120 is greater than the absolute value of the threshold voltage for the second transistor 117. In an exemplary embodiment, the third transistors 120 and the first and second transistors 116, 117 are formed in a same process, and the channel lengths of the third transistors 120 preferably are equal to that of the first transistor 116. In another exemplary embodiment, the third transistors 120 and the first and second transistors 116, 117 are formed in different process instead, and the channel lengths of the third transistors is shorter than that of the second transistor 117 and not equal to that of the first transistor 116.

In addition, the integrated circuit modules with reverse short channel effect can be integrated as standard cells for circuit design, and such standard cells can be used for simulation design of logic circuit.

Figure 3:
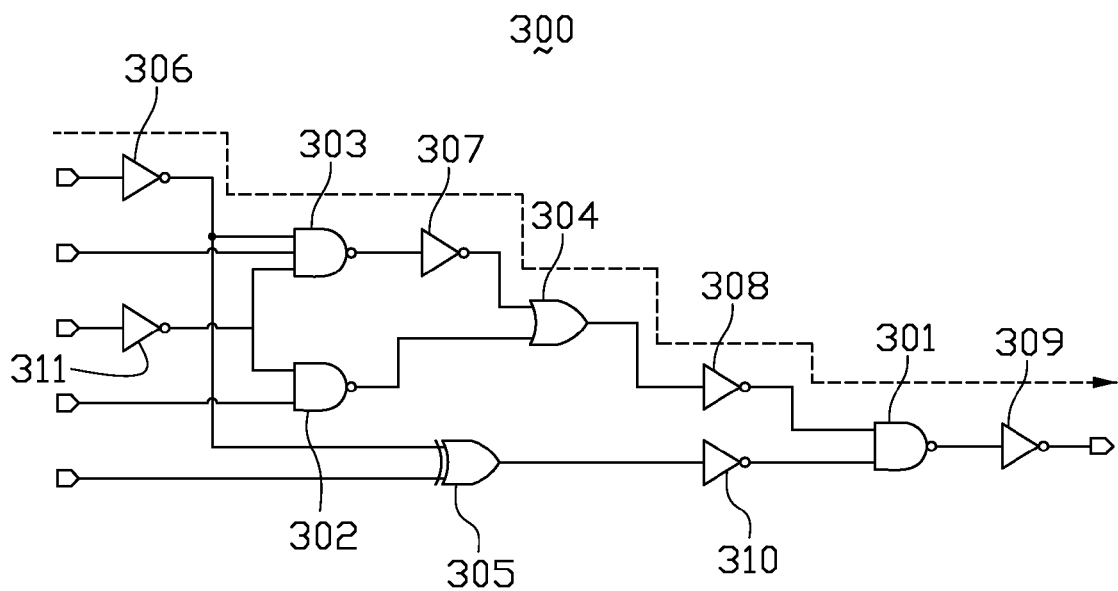
FIG. 3 shows a design schematic of a logic gate circuit in accordance with still another exemplary embodiment.

Referring to FIG. 3, FIG. 3 shows a design schematic of a logic gate circuit 300 in accordance with still another exemplary. As illustrated in FIG. 3, the logic gate circuit 300 is a type of logic circuit diagram designed in laboratory by computer aid according to the requirement of product. In particular, the logic gate circuit 300 includes multiple standard cells such as NAND gates 301, 302, 303, an OR gate 304, an XOR gate 305 and inverters 306, 307, 308, 39, 310, 311.

In order to improve the issue of timing violation of the logic gate circuit 300, the logic gate circuit 300 firstly is analyzed by a simulation tool for example an electronic design automation (EDA) tool to determine a critical path (as denoted by the dotted arrow in FIG. 3, i.e., the longest delay path comprised of the inverters 306, 307, 308, 309, the NAND gates 301, 303 and the OR gate 304). Subsequently, at least one integrated circuit module with reverse short channel effect is selected from a standard cells library to replace at least one general standard cell such as the NAND gate 301, 303 and OR gate 304 in the critical path. By utilizing the reverse short channel effect to decrease the difference between any long delay path and any short delay path, the fastest operation frequency limited by the longest delay path can be increased and thus the timing violation is relieved consequently.

In order to make the reverse short channel effect be dominant, the standard integrated circuit modules with reverse short channel effect advantageously are operated in sub-threshold region, for example operated at a voltage no more than about 0.5V. In other embodiment, the operation voltage of the integrated circuit modules may be higher than, lower than or fall in the general operation voltage range of 0.9~1.2V.

Sum up, in the above described embodiments, integrated circuit modules each include transistors with at least two different channel lengths and reverse short channel effect formed in a same semiconductor process, when the integrated circuit modules are used for the design of logic circuit, only some circuit module(s) in the critical path is/are selected to perform low voltage operation to increase the whole circuit performance, so as to improve the timing violation issue. Since there is no need of replacing all the transistors in the logic circuit to be transistors with reverse short channel effect, and also no need of fixing the operation voltage of the logic circuit in the sub-threshold region, the design of logic circuit is more flexible. In addition, the channel length(s) of some transistor(s) is/are lengthened by using the known transistor manufacturing process, which does not change the critical dimension of transistors and thus would not decrease the process density. Moreover, due to the increase of channel length, the transistor process variation immunity correspondingly is increased, facilitating the reduction of manufacturing cost. Accordingly, the problems in the prior art can be effectively solved, achieving the purpose of developing the present invention.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation to encompass all such modifications and similar structures.

What is claimed is:

1. An integrated circuit module comprising:
   a first transistor, having a first channel length and a first threshold voltage; and
   a second transistor, electrically coupled to the first transistor, having a second channel length and a second threshold voltage,
      wherein the second channel length is twice of the first channel length, the absolute value of the second threshold voltage is smaller than the absolute value of the first threshold voltage, and the first transistor and the second transistor have a same threshold voltage implant concentration.

2. The integrated circuit module as claimed in claim 1, wherein a source of the second transistor is grounded.

3. The integrated circuit module as claimed in claim 1, wherein the integrated circuit module is operated in sub-threshold region.

4. The integrated circuit module as claimed in claim 3, wherein the integrated circuit module has an operation voltage of no more than about 0.5V.

5. The integrated circuit module as claimed in claim 1, wherein the integrated circuit module has an operation voltage higher than, lower than or fall in the range of 0.9 V~1.2V.

6. The integrated circuit module as claimed in claim 1, further comprising:
   a third transistor, electrically coupled to the first and second transistors and having the same threshold voltage implant concentration as the second transistor, wherein the third transistor has a third channel length and a third threshold voltage, the third channel length is smaller than the second channel length, and the absolute value of the third threshold voltage is greater than the absolute value of the second threshold voltage.

7. The integrated circuit module as claimed in claim 1, wherein each of the first transistors and each of the second transistors has a halo implant structure.

8. A method for manufacturing an integrated circuit module, comprising:
   providing a substrate;
   sequentially forming a gate dielectric layer and a gate material layer on the substrate in that order;
   performing a threshold voltage implant process on the gate material layer to define a threshold voltage implant region in the substrate; and
   forming a first transistor and a second transistor electrically coupled with each other on the substrate and thereby respectively defining a first channel and a second channel in the threshold voltage implant region, wherein a length of the second channel is twice of a first channel length of the first channel, the absolute value of the second threshold voltage is smaller than the absolute value of the first threshold voltage, and the first transistor and the second transistor have an identical threshold voltage implant concentration.

9. The method as claimed in claim 8, wherein the formation of the first and second transistors comprises:
   patterning the gate dielectric layer and the gate material layer to form a first gate and a second gate; and
   performing at least an ion implant process to define a first source and drain region and a second source and drain region in the substrate respectively neighboring with the first gate and the second gate.

10. The method as claimed in claim 9, further comprising:
   performing a halo implant process to form a first halo implant region and a second halo implant region respectively underlying the first channel and the second channel and respectively neighboring with the first source and drain region and the second source and drain region.

11. The method as claimed in claim 9, further comprising:
   forming a grounding path to ground the source of the second transistor.

12. The method as claimed in claim 8, further comprising:
   forming a third transistor simultaneously with the formation of the first and second transistors, wherein the third transistor is electrically coupled with the first and second transistors, and a length of a third channel of the third transistor is smaller than the length of the second channel.

13. A computer aided design method for creating a logic circuit, comprising:
   simulating a design of the logic circuit by a computer aided simulation tool, wherein the logic circuit is comprised of a plurality of standard integrated circuit modules;
   analyzing the logic circuit to determine a critical path in the logic circuit; and
   providing an integrated circuit module with reverse short channel effect to replace at least one of the standard integrated circuit modules in the critical path, wherein the integrated circuit module with revere short channel effect comprises:
      a first transistor, having a first channel length and a first threshold voltage; and
      a second transistor, electrically coupled to the first transistor, having a second channel length and a second threshold voltage, wherein the second channel length is twice of the first channel length, the absolute value of the second threshold voltage is smaller than the absolute value of the first threshold voltage, and the first transistor and the second transistor have a same threshold voltage implant concentration.

14. The computer aided design method as claimed in claim 13, wherein a source of the second transistor is grounded.

15. The computer aided design method as claimed in claim 13, wherein the integrated circuit module with reverse short channel effect is operated in sub-threshold region and has an operation voltage of no more than about 0.5V.

16. The computer aided design method as claimed in claim 13, wherein the integrated circuit module with reverse short channel effect has an operation voltage higher than, lower than or fall in the range of about 0.9V~1.2V.

17. The computer aided design method as claimed in claim 13, wherein each of the first and second transistors has a halo implant structure.

18. The computer aided design method as claimed in claim 13, wherein the integrated circuit module with reverse short channel effect further comprises a third transistor electrically coupled to the first and second transistors and having the same threshold voltage implant concentration as the second transistor, the third transistor has a third channel length and a third threshold voltage, the third channel length is smaller than the second channel length, and the absolute value of the third threshold voltage is greater than the absolute value of the second threshold voltage.

* * * * *